US012620977B2

(12) United States Patent
Leblanc et al.

(10) Patent No.: US 12,620,977 B2
(45) Date of Patent: May 5, 2026

(54) DEVICE AND METHOD FOR PROCESSING A DIGITAL SIGNAL

(71) Applicant: Aktiebolaget SKF, Gothenburg (SE)

(72) Inventors: James P. Leblanc, Luleå (SE); Patrik Pääjärvi, Södra Sunderbyn (SE)

(73) Assignee: Aktiebolaget SKF, Gothenburg (SE)

( * ) Notice: Subject to any disclaimer, the term of this patent is extended or adjusted under 35 U.S.C. 154(b) by 221 days.

(21) Appl. No.: 18/482,983

(22) Filed: Oct. 9, 2023

(65) Prior Publication Data

US 2024/0137010 A1     Apr. 25, 2024

(30) Foreign Application Priority Data

Oct. 17, 2022    (DE) .......................... 102022210929.5

(51) Int. Cl.
H03M 7/00        (2006.01)
H03H 17/02       (2006.01)
H03H 17/06       (2006.01)
(52) U.S. Cl.
CPC .... H03H 17/0628 (2013.01); H03H 17/0213 (2013.01)
(58) Field of Classification Search
CPC .... H03M 1/0836; H03M 1/0626; H03M 1/12; H03M 3/508; H03M 7/3042; H03M 1/0624; H03M 1/82; H03M 3/37; H03M 3/438; H03M 3/442; H03M 3/484; H03L 2207/50; H03L 7/0814; H03L 7/093; H03L 7/0994; H03L 7/18; H04L 7/0029; H04L 2027/0057; H04L 27/2273; H04L 7/0062; H04L 1/0057; H04L 1/0071; H04L 2007/047; H04L 2025/03509; H04L 2027/0028; H04L 2027/0032; (Continued)

(56) References Cited

U.S. PATENT DOCUMENTS 4,755,761 A    7/1988   Ray
4,866,647 A    9/1989   Farrow
        (Continued)

FOREIGN PATENT DOCUMENTS

CN    113074941 B    8/2022
WO    2012012963 A1  2/2012

OTHER PUBLICATIONS

Pei et al., "Design of Variable Comb Filter Using Fir Variable Fractional Delay Element," Signal Processing, 92(10): 2409-2421, Oct. 2012.

(Continued)

*Primary Examiner* — Linh V Nguyen
(74) *Attorney, Agent, or Firm* — Stinson LLP

(57) ABSTRACT

A device for processing a digital signal includes a Farrow structure (14) that applies to the digital signal a time-varying sample rate conversion from the fixed sample rate to a time varying sampling. The digital signal sampled at the time varying sampling is a resulting signal. The Farrow structure (14) is controlled from a control variable. A spectral analysis means (15) performs a spectral analysis of the resulting signal to determine the frequency values of the resulting signal. A determining means (16) determines a sparseness parameter of the frequency values of the resulting signal. A controlling means (17) modifies the control variable according to the value of the sparseness parameter.

14 Claims, 4 Drawing Sheets

(58) Field of Classification Search

CPC ..... H04L 2027/0036; H04L 2027/0038; H04L 2027/0055; H04L 2027/0071; H04L 2027/0081; H04L 25/03006; H04L 25/03012; H04L 25/05; H04L 27/0008; H04L 27/22; H04L 27/2626; H04L 27/2647; H04L 27/2649; H04L 27/2662; H04L 27/38; H04L 27/3809; H04L 27/3827; H04L 27/3872; H04L 65/60; H04L 7/0004; H04L 7/0025; H04L 7/0274; H04L 7/0278; H04L 7/0335; H04L 7/04; G11B 20/10009; G11B 20/10037; G11B 20/10055; G11B 20/1403; G11B 5/09; G11B 5/012; G11B 20/10027; G11B 20/10222; G11B 20/10296; G11B 20/1426; G11B 27/36; G11B 5/035; H03H 17/028; H03H 17/0628; H03H 17/0027; H03H 17/02; H03H 17/0211; H03H 17/0242; H03H 17/0275; H03H 17/0294; H03H 17/0621; H03H 17/0635; H03H 17/0685; H03H 2017/0214; H03H 2218/14; G06F 17/17; G06F 1/0321; G06F 17/16; G06F 18/00; G06F 2218/00; G06F 7/5443; G06F 7/78

USPC .................................. 341/61, 140, 142, 155

See application file for complete search history.

(56) References Cited

U.S. PATENT DOCUMENTS

| | | | |
|---|---|---|---|
| 5,495,203 A | | 2/1996 | Harp et al. |
| 5,717,619 A * | | 2/1998 | Spurbeck ......... G11B 20/10009 708/319 |
| 5,892,632 A * | | 4/1999 | Behrens .......... G11B 20/10055 |
| 5,943,369 A * | | 8/1999 | Knutson .............. H03L 7/0814 348/E5.009 |
| 5,999,355 A * | | 12/1999 | Behrens .......... G11B 20/10009 375/232 |
| 6,005,640 A | | 12/1999 | Strolle et al. |
| 6,282,248 B1 * | | 8/2001 | Farrow ................... H04L 27/38 329/304 |
| 6,295,325 B1 * | | 9/2001 | Farrow ................ H04L 7/0278 375/327 |
| 6,351,714 B1 | | 2/2002 | Birchmeier |
| 6,452,948 B1 | | 9/2002 | McCallister et al. |
| 6,487,672 B1 * | | 11/2002 | Byrne ............. G11B 20/10296 713/400 |
| 6,512,468 B1 | | 1/2003 | Zhong |
| 6,545,532 B1 * | | 4/2003 | Maalej ................ H04L 27/3809 375/324 |
| 7,340,024 B1 | | 3/2008 | Nelson et al. |
| 7,369,637 B1 * | | 5/2008 | Mauer ................. H03H 17/028 370/914 |
| 8,289,195 B1 | | 10/2012 | Dong et al. |
| 8,786,472 B1 | | 7/2014 | Prince |
| 9,000,958 B1 | | 4/2015 | Park et al. |
| 11,002,635 B2 * | | 5/2021 | Hubert ............... G01M 13/045 |
| 2004/0160346 A1 | | 8/2004 | Husted et al. |
| 2007/0136410 A1 | | 6/2007 | Barford |
| 2010/0087227 A1 | | 4/2010 | Francos et al. |
| 2010/0091688 A1 | | 4/2010 | Staszewsk et al. |
| 2010/0158179 A1 | | 6/2010 | Becker et al. |
| 2016/0087787 A1 | | 3/2016 | Kim et al. |
| 2016/0277007 A1 | | 9/2016 | Tangudu et al. |
| 2018/0316482 A1 | | 11/2018 | Gudovskiy et al. |
| 2019/0110084 A1 | | 4/2019 | Jia et al. |
| 2023/0080835 A1 * | | 3/2023 | Liu ........................ H02P 29/024 324/765.01 |
| 2023/0198503 A1 * | | 6/2023 | Goto ................... H03H 9/02574 333/193 |
| 2023/0305104 A1 * | | 9/2023 | Hekstra ................... G01S 7/032 |
| 2024/0333329 A1 * | | 10/2024 | Wallace .............. H04L 27/2649 |

OTHER PUBLICATIONS

Preliminary Search Report of the National Intellectual Property Office of France in Application No. FR2310857, dated Mar. 20; 9pgs.

* cited by examiner

1

DEVICE AND METHOD FOR PROCESSING A DIGITAL SIGNAL

CROSS-REFERENCE TO RELATED APPLICATION

This application claims priority to German Application No. 102022210929.5, filed Oct. 17, 2022, the entirety of which is hereby incorporated by reference.

FIELD

The present disclosure is directed to devices for processing a digital signal and methods for processing a digital signal.

BACKGROUND

Condition monitoring algorithms, for example to detect a fault of a bearing such as a fault of an inner raceway of the bearing, require a constant rotational speed of the bearing to work properly.

Generally, condition monitoring algorithms perform spectral analysis of the rotating bearing to detect faults from specific tones and harmonics.

Rotational speed changes of the bearing during signal measurement smears out the spectral tones reducing the ability to identify the frequencies and harmonics that may be associated with faults, for example faults of an inner raceway of the bearing or faults of the outer raceway of the bearing.

Consequently, the present disclosure intends to correct deleterious effects of rotational speed changes to perform a spectral analysis.

SUMMARY

According to an aspect, a method for processing a digital signal comprising samples of a continuous signal sampled at a fixed sample rate, the continuous signal being representative of vibrations of a bearing undergoing rotational speed changes is proposed.

The method comprises:

applying to the digital signal a time-varying sample rate conversion by a Farrow structure from the fixed sample rate to a time varying sampling, the digital signal sampled at the time varying sampling being a resulting signal, the Farrow structure being controlled from a control variable;

performing a spectral analysis of the resulting signal to determine the frequency values of the resulting signal;

determining a sparseness parameter of the frequency values of the resulting signal; and modifying the control variable according to the value of the sparseness parameter.

The method permits the use of existing constant rotation speed algorithms in conditions of varying rotational speed so that repetitive attempts to obtain constant-speed data acquisition are not necessary.

The suppression of repetitive attempts at data acquisition permit to save supply power of a device implementing the method for example a wireless power comprising a supply source such as a battery.

Advantageously, performing a spectral analysis of the resulting signal comprises performing a fast Fourier transform of the resulting signal.

Preferably, the statistical parameter of the frequency values is the skewness of the frequency values.

Advantageously, modifying the intermediate sampling comprises implementing a line search algorithm to modify the control variable.

According to an aspect, a device for processing a digital signal comprising samples of a continuous signal sampled at a fixed sample rate, the continuous signal being representative of vibrations of a bearing undergoing rotational speed changes is proposed.

The device comprises:

a Farrow structure configured to apply to the digital signal a time-varying sample rate conversion from the fixed sample rate to a time varying sampling, the digital signal sampled at the time-varying sampling being a resulting signal, and the Farrow structure being configured to be controlled from a control variable;

spectral analysis means configured to perform a spectral analysis of the resulting signal to determine the frequency values of the resulting signal;

determining means configured to determine a sparseness parameter of the frequency values of the resulting signal; and controlling means configured to modify the control variable according to the value of the sparseness parameter.

Preferably, the spectral analysis means are configured to implement a fast Fourier transform algorithm.

Advantageously, the statistical parameter of the frequency values is the skewness of the frequency values.

Preferably, the controlling means are configured to implement a line search algorithm to modify the control variable.

According to an aspect, a bearing device is proposed.

The bearing device comprises:

a bearing provided with an inner ring and with an outer ring capable of rotating concentrically relative to one another;

a sensor configured to measure the vibrations of the said inner or outer ring and configured to deliver a continuous signal;

a sampler configured to sample the continuous signal at a fixed sample rate and configured to deliver the digital signal comprising the samples; and a device as defined above configured to process the digital signal.

BRIEF DESCRIPTION OF THE DRAWINGS

Other advantages and features of the present disclosure will appear on examination of the detailed description of embodiments, in no way restrictive, and the appended drawings in which.

DETAILED DESCRIPTION

Figure 1:
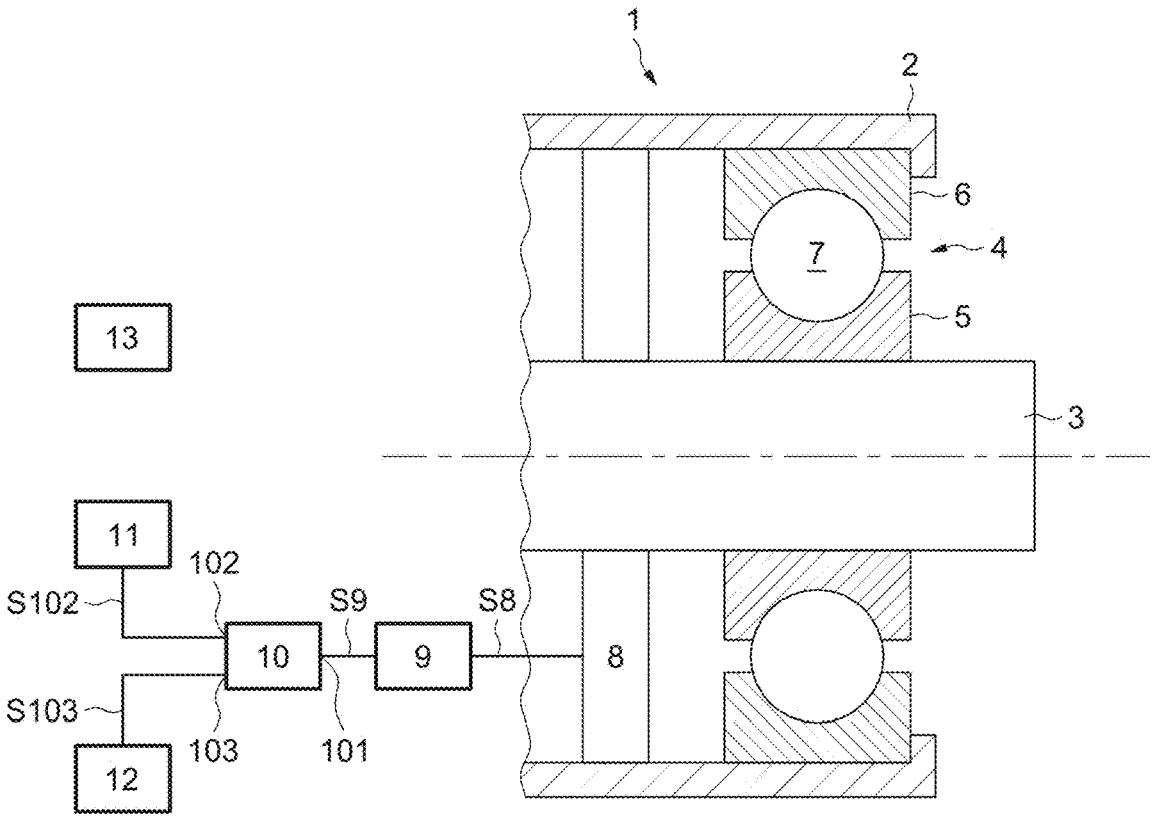
FIG. 1 illustrates schematically a rotating machine according to the present disclosure.

Reference is made to FIG. 1 which represents schematically a partial longitudinal cross section of a machine 1.

The machine 1 comprises a housing 2 and a shaft 3 supported in the housing 2 by a rolling bearing 4 (e.g. roller bearing or ball bearing).

The rolling bearing 4 is provided with an inner ring 5 mounted on the shaft 3, and with an outer ring 6 mounted into the bore of the housing 2. The outer ring 6 radially surrounds the inner ring 5. The inner and outer rings 5, 6 rotate concentrically relative to one another.

The rolling bearing 4 is further provided with a row of rolling elements 7 radially interposed between inner and outer raceways of the inner and outer rings 5, 6. In the illustrated example, the rolling elements 7 are balls. Alternatively, the rolling bearing may comprise other types of rolling elements 7, for example rollers. In the illustrated example, the rolling bearing comprise one row of rolling elements 7. Alternatively, the rolling bearing comprise may comprise several rows of rolling elements.

A sensor 8 is mounted in the housing 2 to measure vibrations of the bearing 4 undergoing rotational speed changes.

The sensor 8 may be mounted on a bore of the housing 2.

In variant, the sensor 8 may be mounted elsewhere on the machine, near the outer ring 6 or in the vicinity of housing 2, for example.

The sensor 8 delivers a continuous signal S8 representative of the vibrations of the bearing 4 to an input of a sampler 9.

The sampler 9 delivers a digital signal S9 comprising multiple sequential samples $x_p$ of the continuous signal S8 sampled at a fixed sample rate to an input 101 of a device 10 for processing the digital signal S9, p being an integer.

The bearing 4, the sensor 8, the sampler 9 and the device 10 form a bearing device.

A memory (not represented) may store the output signal S9 and delivers the output signal S9 to the device 10.

A first output 102 of the device 10 is connected to first implementing means 11 implementing at least one constant speed time domain algorithm from a first output signal S102 delivers by the device 10 on the first output 102, for example to implement an enveloping fault detection algorithm.

A second output 103 of the device 10 is connected to second implementing means 12 implementing at least one constant speed spectral oriented algorithm from a second output signal S103 delivers by the device 10 on the second output 103, for example to implement a fast Fourier transform paired with a fault frequencies detection method.

The first and second implementing means 11, 12 are for example each made of a processing unit implementing the said algorithm.

A processing unit 13 implements the sensor 8, the sampler 9, and the device 10.

Figure 2:
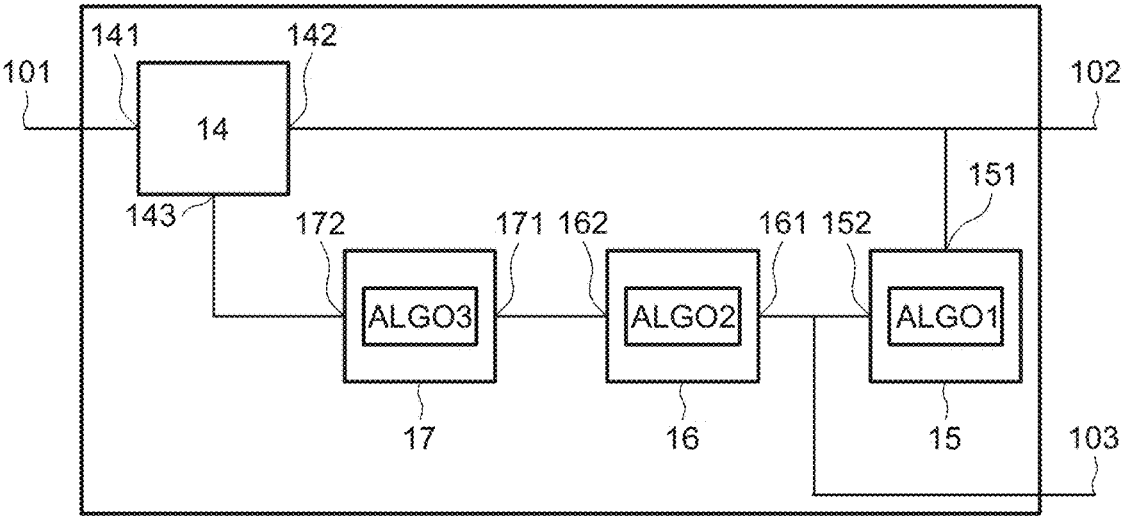
FIG. 2 illustrates schematically an example of a device for processing a digital signal according to the present disclosure.

FIG. 2 illustrates schematically an example of the device 10.

The device 10 comprises a Farrow structure 14 know from the document U.S. Pat. No. 4,866,647, spectral analysis means 15, determining means 16, and controlling means 17.

The Farrow structure 14 comprises an input 141 connected to the input 101 of the device 10, an output 142 connected to the first output 102 of the device 10 and to an input 151 of the spectral analysis means 15, and comprises a control input 143 connected to an output 172 of the controlling means 17.

An output 152 of the spectral analysis means 15 is connected to the second output 103 of the device 10 and to an input 161 of the determining means 16.

An output 162 of the determining means 16 is connected to an input of the controlling means 17.

The spectral analysis means 15 comprise a spectral analysis algorithm ALGO1, for example a fast Fourier transform algorithm.

The determining means 16 comprise an algorithm ALGO2 to determine a sparseness parameter.

The sparseness parameter comprises for example skewness or kurtosis.

It is assumed that the algorithm ALGO2 determines skewness so that the determining means 16 output the skewness of the data received on the input 161 of the determining means 16.

The controlling means 17 comprise a line search algorithm ALGO3, for example fixed step size, gear shifting, golden-section or gradient estimation.

The Farrow structure 14 iteratively adjusts intersample delays (resampling) of measurement data.

The Farrow structure 14 is based on a N order finite impulse response FIR filter with coefficients $h(n, \Delta)$ that may be varied by means of a control variable $\Delta$ equal to the intersample position or delay of the Farrow structure, n being an integer between 0 and N.

The filter coefficients $h(n, \Delta)$ are formed from a polynomial of the control variable $\Delta$.

The coefficient $h(n, \Delta)$ is equal to:

$$h(n, \Delta) = \sum_{m=0}^{M} C_{mn} \Delta^m \qquad (1)$$

where M is the order of a set of polynomials whose value is chosen by performance needs. The matrix C represents the collection of each coefficient $C_{mn}$ of each M-order polynomial for each filter coefficient $h(n, \Delta)$. Each $C_{mn}$ coefficient implements the (n+1)-tap filter implementing a delay of $\Delta$ denoted as $h(n, \Delta)$.

The coefficients $C_{mn}$ may be represented as a coefficient matrix C of dimension (M+1)×(N+1).

$$C = \begin{bmatrix} C_{00} & \cdots & C_{0N} \\ \vdots & \ddots & \vdots \\ C_{M0} & \cdots & C_{MN} \end{bmatrix} \qquad (2)$$

The transfer function $H(z, \Delta)$ of the Farrow structure 14 is given by:

$$H(z, \Delta) = \sum_{m=0}^{M} C_m(z) \cdot \Delta^m \qquad (3)$$

with $$C_m(z) = \sum_{n=0}^{N} C_{mn} \cdot z^{-n} \qquad (4)$$

for m varying between 0 and M, and n varying from 0 and N.

The term $C_m(z)$ refers to a subfilter of the Farrow structure 14, the Farrow structure 14 comprising M+1 subfilters.

Figure 3:
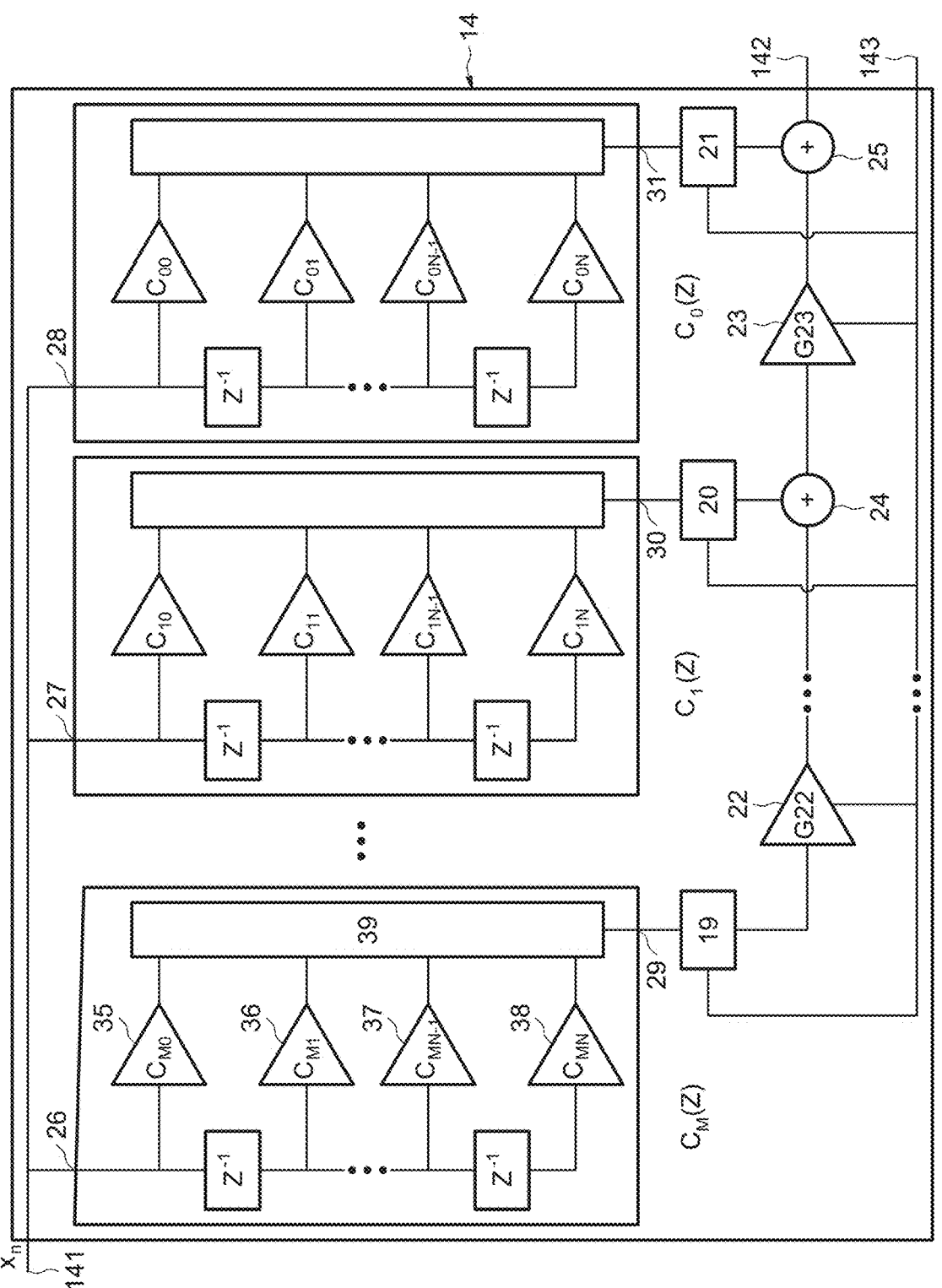
FIG. 3 illustrates schematically an example of a Farrow structure.

FIG. 3 illustrates schematically an example of the Farrow structure 14.

The Farrow structure 14 comprises M+1 subfilters denoted $C_M(z)$, . . . , $C_1(z)$, $C_0(z)$, M+1 memory banks 19, 20, 21, M multipliers 22, 23 having each a variable gain G22, G23, and M adders 24, 25.

Each multiplier 22, 23 comprises an input, an output delivering a signal received on the input multiplied by the variable gain G22, G23, and a control input receiving the variable gain value.

Each adder 24, 25, comprises a first and a second inputs, and an output delivering the sum of the first and second inputs.

Each subfilter $C_M(z)$, . . . , $C_1(z)$, $C_0(z)$ comprises an input 26, 27, 28 connected to the input 141 of the Farrow structure and an output 29, 30, 31 connected to an input of a different memory bank 19, 20, 21.

An output of the $M^{th}$ memory bank 19 is connected to the input of the $M^{th}$ multiplier 22.

Each output of the $M-1^{th}$ to the first memory banks 20, 21 is connected to the first input of a different adders 24, 25.

The output of the $M^{th}$ multiplier is connected to the input of the next stage's adder. For example, as seen in FIG. 3, the output of multiplier 23 is connected to the second input of adder 25.

The output of the final adder 25 is connected to the output 142 of the Farrow structure 14.

Each memory bank 19, 20, 21 is connected to the control input 143 to select which memory data item of each memory bank 19, 20, 21 is forwarded to the multiplier G22, G23 and adders 24, 25.

The control input of the M variable gains G22, G23 is connected to the control input 143 of the Farrow structure 14 to control the value of the variable gains having each the same value.

As the structure of the subfilters $C_M(z)$, . . . , $C_1(z)$, $C_0(z)$ is identical, only the structure of the subfilters $C_M(z)$ is detailed.

The subfilter $C_M(z)$ comprises a chain of N delay elements D 33, 34, N second multipliers 35, 36, 37, 38 and a second summer 39.

The N second multipliers 35, 36, 37, 38 multiply N+1 sequential samples $x_n$, of the signal received on the input 26 of the subfilter $C_M(z)$ by the N+1 filter coefficients $C_{M0}$ to $C_{MN}$ and deliver the multiplied sequential samples $x_n$, to the second summer 39.

The second summer 39 sums the N+1 sequential samples $x_n$, multiplied by the N+1 second multipliers 35, 36, 37, 38 and delivers the sum to the input of the memory bank 19.

Figure 4:
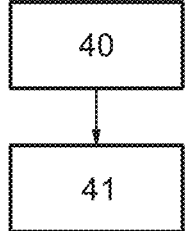
FIG. 4 illustrates schematically a method to determine the coefficients of the Farrow structure.

FIG. 4 illustrates an example of a known method from the prior art to determine the coefficients $C_{mn}$ of the coefficient matrix C of dimension (M+1)×(N+1).

In a step 40, the order N of the Farrow structure 14 and the order M of the polynomial is defined according to the required accuracy of the device 10.

At any single instant of time, the control value Δ of each multiplier G22, G23 is the same.

In another embodiment, the control value Δ of each multiplier G22, G23 may be varying on a sample by sample basis and are denoted $Δ_n$. The values of the fractional delay $Δ_n$ are controlled by a control unit of the device 10 (not represented) and are chosen according to the needed fractional delay to be applied to each input sample $x_n$. The control unit also selects which data sample is extracted from memories 19, 20, 21 according to the fractional delay $Δ_n$ to achieve the necessary integer component of the needed delay.

To provide for the implementation of a continuous range of delays, the Farrow structure relies on a polynomial curve fitting based on a set of fixed-delay reference filters. For example, assuming a bank of 8 reference filters each implementing a fixed delay, the fixed delay Δ for each reference filter could be chosen between −0.5 to 0.5 in increments of 0.125 so that the integer j varies between 0 and 7 with $Δ_0$=−0.5, . . . $Δ_1$=−0.375, . . . $Δ_7$=+0.375.

In a step 41, a set of functions $g_j(n, Δ_j)$ is computed for each j value and a given n value.

The function $g_j$ may be for example equal to:

$$g_j(n, Δ_j) = \frac{\sin(\pi(n - Δ_j))}{\pi(n - Δ_j)} \tag{5}$$

In step 42, the coefficients $C_{mn}$ of the coefficient matrix C are determined so that for a given n value and the desired delay value Δ, the filter coefficient h(n, Δ) fits the polynomial interpolation of functions $g_j(n, Δ_j)$ defined by $C_{mn}$ for all values of Δ between −0.5 to +0.5.

Figure 5:
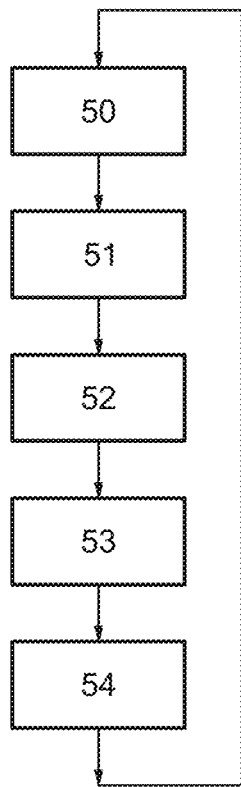
FIG. 5 illustrates schematically a method for processing a digital signal according to the present disclosure.

FIG. 5 illustrates an example of implementation of the device 10.

It is assumed that the coefficient matrix C is defined and that the subfilters $C_M(z)$, . . . , $C_1(z)$, $C_0(z)$ are parametrized according to the coefficient matrix C.

In a step 50, the sampler 9 delivers the digital signal S9 comprising the samples $x_p$ from the continuous signal S8 delivered by the sensor 8.

In a step 51, the Farrow device 14 applies to the digital signal S9 comprising the samples $x_p$ a time-varying sample rate conversion from the fixed sample rate to a time-varying sample interval, and delivers on the output 142 of the Farrow device 14 a resulting signal comprising the digital signal sampled at the time-varying sample interval achieving speed change compensation.

The resulting signal is the first output signal S102 delivered on the first output 102 of the device 10.

The time-variation of the resulting sampling depends on the value of the control value Δ delivered by the controlling means 17.

In step 52, the spectral analysis means 15 perform a spectral analysis of the resulting signal S102 to determine the frequency values of the resulting signal S102 using the algorithm ALGO1 and outputs the second output signal S103 on the output 152 of the spectral analysis means 15.

In step 53, the determining means 16 determine the skewness of the frequency values of the spectral analysis using the algorithm ALGO2 and outputs the determined skewness value on the output 162 of the determining means 16.

In step 54, the controlling means 17 implement the line search algorithm ALGO3 on the skewness value and deliver a control value of the control variable Δ on the control input 143 of the device 10 to reduce the parasitic frequency smearing in the spectral analysis due to machinery speed changes.

The method goes back to step 50 with the next samples $x_p$ delivered by the sampler 9.

Figure 6:
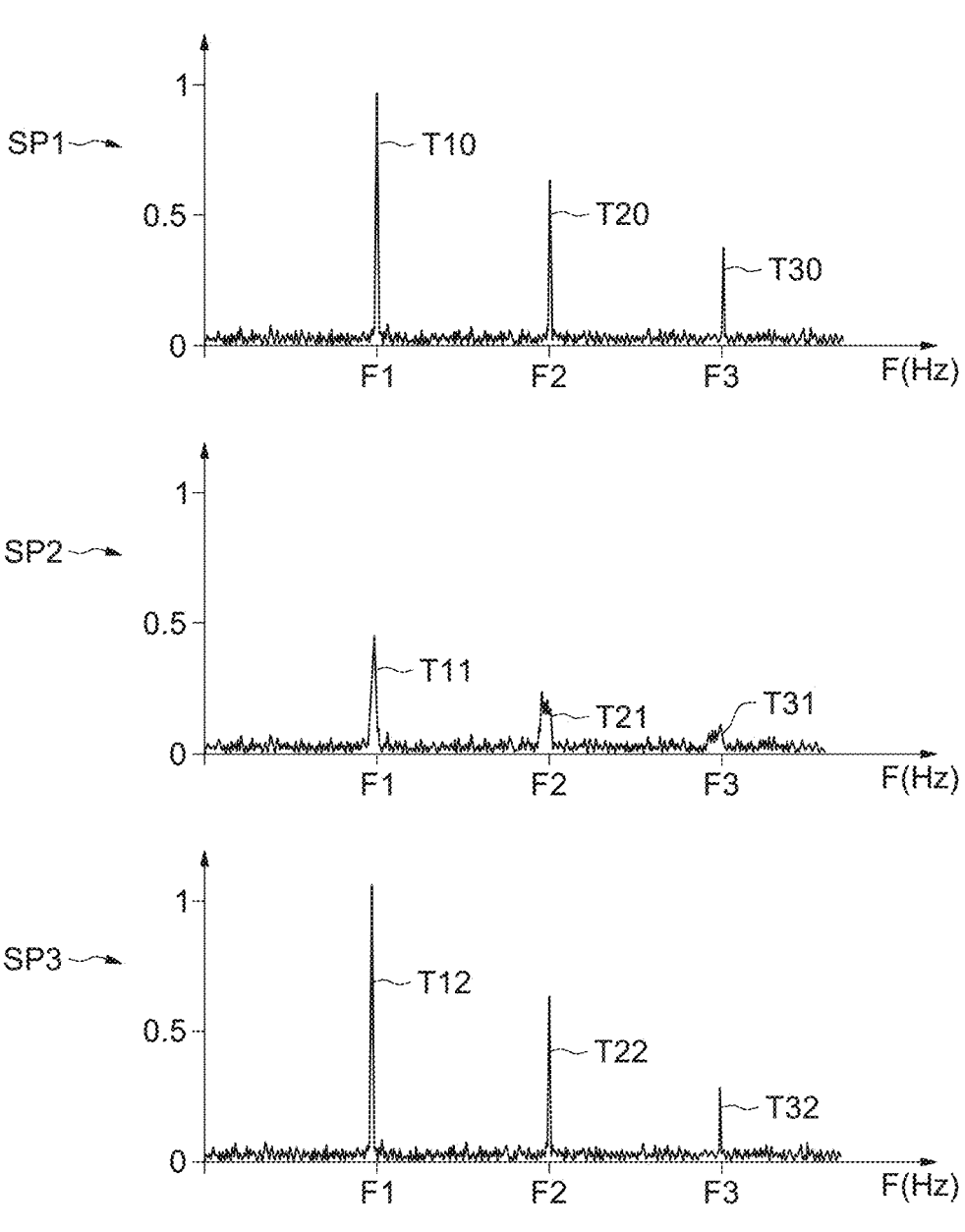
FIG. 6 illustrates schematically examples of spectrum delivered by spectral analysis means for a steady rotation speed of a bearing, when the speed of the bearing is decreased during measurement according to the prior art and according to the present disclosure.

FIG. 6 illustrates the spectrum of vibrations delivered by the sensor 8 for a steady rotation speed of the bearing 4 represented by the graph SP1, the spectrum represented by the graph SP2 when the rotation speed of the bearing 4 has undergone a speed change of 3% during data collection compared to the steady rotation speed when the sensor 8 measures the rotation speed.

A graph SP3 is plotted and represents the spectrum delivered on the second output 103 of the device 10 when the rotation speed of the bearing 4 has undergone a 3% speed change during data collection after application of speed change compensation. This compares closely to the steady rotation speed.

In the graph SP1, three tones T10, T20, T30 are easily identifiable at the respective frequencies F1, F2, F3.

The tone T10 is the fundamental and the tones T20, T30 are two harmonics. The skewness value of the graph SP1 is the reference skewness value.

In the graph SP2, three tones T11, T21, T31 having reduced peaks are hardly identifiable. It is not possible to ascertain their precise location so that the constant speed time domain algorithm implemented by the first implementing means 11 and the constant speed spectral oriented algorithm implemented by the second implementing means 12 may not ascertain if the three tones T11, T21, T31 are of interest. The skewness value of the graph SP1 is smaller than the reference skewness value.

In the graph SP3, three tones T12, T22, T33 are easily identifiable at the respective frequencies F1, F2, F3.

The skewness value of the graph SP3 has been increased from the skewness value of SP2 and is similar to the reference skewness value.

The device 10 re-establishes the sharp peaks of the tones T12, T22, T32 and their frequencies F1, F2, F3.

The device 10 permits to use existing constant rotation speed algorithms when the rotation speed is varying so that repetitive attempts at data acquisition due to speed changes are not necessary.

The suppression of repetitive attempts at data acquisition permit to save supply power of a device comprising the sensor 8, the sampler 9 and the device 10, for example a wireless power comprising a supply source such as a battery.

What is claimed is:

1. A method for processing a digital signal comprising samples of a continuous signal sampled at a fixed sample rate, the continuous signal being representative of vibrations of a bearing undergoing rotational speed changes, the method comprising:

applying to the digital signal a time-varying sample rate conversion by a Farrow structure from the fixed sample rate to a time varying sampling, the digital signal sampled at the time varying sampling being a resulting signal, the Farrow structure being controlled from a control variable;

performing a spectral analysis of the resulting signal to determine frequency values of the resulting signal;

determining a sparseness parameter of the frequency values of the resulting signal; and modifying the control variable according to the value of the sparseness parameter.

2. The method according to claim 1, wherein performing a spectral analysis of the resulting signal comprises performing a fast Fourier transform of the resulting signal.

3. The method according to claim 1, wherein a statistical parameter of the frequency values is a skewness of the frequency values.

4. The method according to claim 1, further comprising modifying an intermediate sampling including implementing a line search algorithm to modify the control variable.

5. The method according to claim 2, wherein a statistical parameter of the frequency values is a skewness of the frequency values.

6. The method according to claim 5, further comprising modifying an intermediate sampling including implementing a line search algorithm to modify the control variable.

7. A device for processing a digital signal comprising samples of a continuous signal sampled at a fixed sample rate, the continuous signal being representative of vibrations of a bearing undergoing rotational speed changes, the device comprising:

a Farrow structure configured to apply to the digital signal a time-varying sample rate conversion from the fixed sample rate to a time varying sampling, the digital signal sampled at the time varying sampling being a resulting signal, and the Farrow structure being configured to be controlled from a control variable;

spectral analysis means configured to perform a spectral analysis of the resulting signal to determine frequency values of the resulting signal;

determining means configured to determine a sparseness parameter of the frequency values of the resulting signal; and controlling means configured to modify the control variable according to the value of the sparseness parameter.

8. The device according to claim 7, wherein the spectral analysis means are configured to implement a fast Fourier transform algorithm.

9. The device according to claim 7, wherein a statistical parameter of the frequency values is a skewness of the frequency values.

10. The device according to claim 7, wherein the controlling means are configured to implement a line search algorithm to modify the control variable.

11. A bearing device comprising:

a bearing provided with an inner ring and with an outer ring capable of rotating concentrically relative to one another;

a sensor configured to measure the vibrations of the said inner or outer ring and configured to deliver a continuous signal;

a sampler configured to sample the continuous signal at a fixed sample rate and configured to deliver the digital signal comprising the samples; and a device according to claim 7 configured to process the digital signal.

12. The device according to claim 8, wherein a statistical parameter of the frequency values is a skewness of the frequency values.

13. The device according to claim 12, wherein the controlling means are configured to implement a line search algorithm to modify the control variable.

14. A bearing device comprising:

a bearing provided with an inner ring and with an outer ring capable of rotating concentrically relative to one another;

a sensor configured to measure the vibrations of the said inner or outer ring and configured to deliver a continuous signal;

a sampler configured to sample the continuous signal at a fixed sample rate and configured to deliver the digital signal comprising the samples; and a device according to claim 13 configured to process the digital signal.

* * * * *